United States Patent
Tusques

[11] Patent Number: 5,384,431
[45] Date of Patent: Jan. 24, 1995

[54] JOINT ASSEMBLY FOR POWER AND SIGNAL COUPLING BETWEEN RELATIVELY ROTATABLE STRUCTURES

[75] Inventor: Alain Tusques, Alta Loma, Calif.

[73] Assignee: Schaeffer Magnetics, Inc., Chatsworth, Calif.

[21] Appl. No.: 59,536

[22] Filed: May 11, 1993

Related U.S. Application Data

[63] Continuation-in-part of Ser. No. 737,784, Jul. 30, 1991, Pat. No. 5,210,378.

[51] Int. Cl.⁶ ............................................. H01B 7/08
[52] U.S. Cl. .................................. 174/117 F; 174/47; 174/75 R; 174/117 FF; 174/268; 361/749; 385/114
[58] Field of Search ............ 174/117 F, 117 FF, 268, 174/75 R, 75 F, 47, 86, 21 JR, 72 TR; 361/749; 385/114

[56] References Cited

U.S. PATENT DOCUMENTS

| | | | |
|---|---|---|---|
| 243,180 | 6/1881 | Ware | 174/117 F X |
| 2,774,382 | 12/1956 | Bentley | 174/47 X |
| 3,818,122 | 6/1974 | Luetzow | 174/86 |
| 3,979,763 | 9/1976 | Mills | 174/86 X |
| 4,146,302 | 3/1979 | Jachimowicz | 385/114 |
| 4,542,858 | 9/1985 | Manges | 191/12.2 R X |
| 4,587,719 | 5/1986 | Barth | 361/749 |
| 4,816,617 | 3/1989 | Valosen | 174/86 |
| 4,939,514 | 7/1990 | Miyazaki | 361/749 |
| 5,130,895 | 7/1992 | Somemiya et al. | 361/749 |
| 5,210,378 | 5/1993 | Tusques | 174/117 F |
| 5,250,758 | 10/1993 | Fjelstad et al. | 174/254 |

FOREIGN PATENT DOCUMENTS

| | | | |
|---|---|---|---|
| 1041127 | 10/1958 | Germany | 174/69 |
| 1615745 | 5/1970 | Germany | 174/86 |

*Primary Examiner*—Morris H. Nimmo
*Attorney, Agent, or Firm*—Blakely, Sokoloff, Taylor & Zafman

[57] ABSTRACT

The present invention is a joint assembly for allowing relative rotational movement of a camera relative to a stationary base structure. The assembly has a first flexible member which allows the camera to pan the surrounding are and a second flexible member which allows the camera to tilt. Each flexible member has a first surface facing a first direction and second surface facing a second opposite direction. One end each flexible member is folded over onto itself so that a portion of the second surface faces the first direction. The flexible members are constructed in an essentially radial shape to define a radial path. When an end of a flexible member moves along the arcuate path the member rolls over itself. That is, the portion of the flexible member that is rolled over, has its second surface facing the first direction instead of the second direction. The flexible member is preferably constructed with a plurality of electrical lines or wires, wherein all the wires move in an orderly pattern without entanglement.

9 Claims, 2 Drawing Sheets

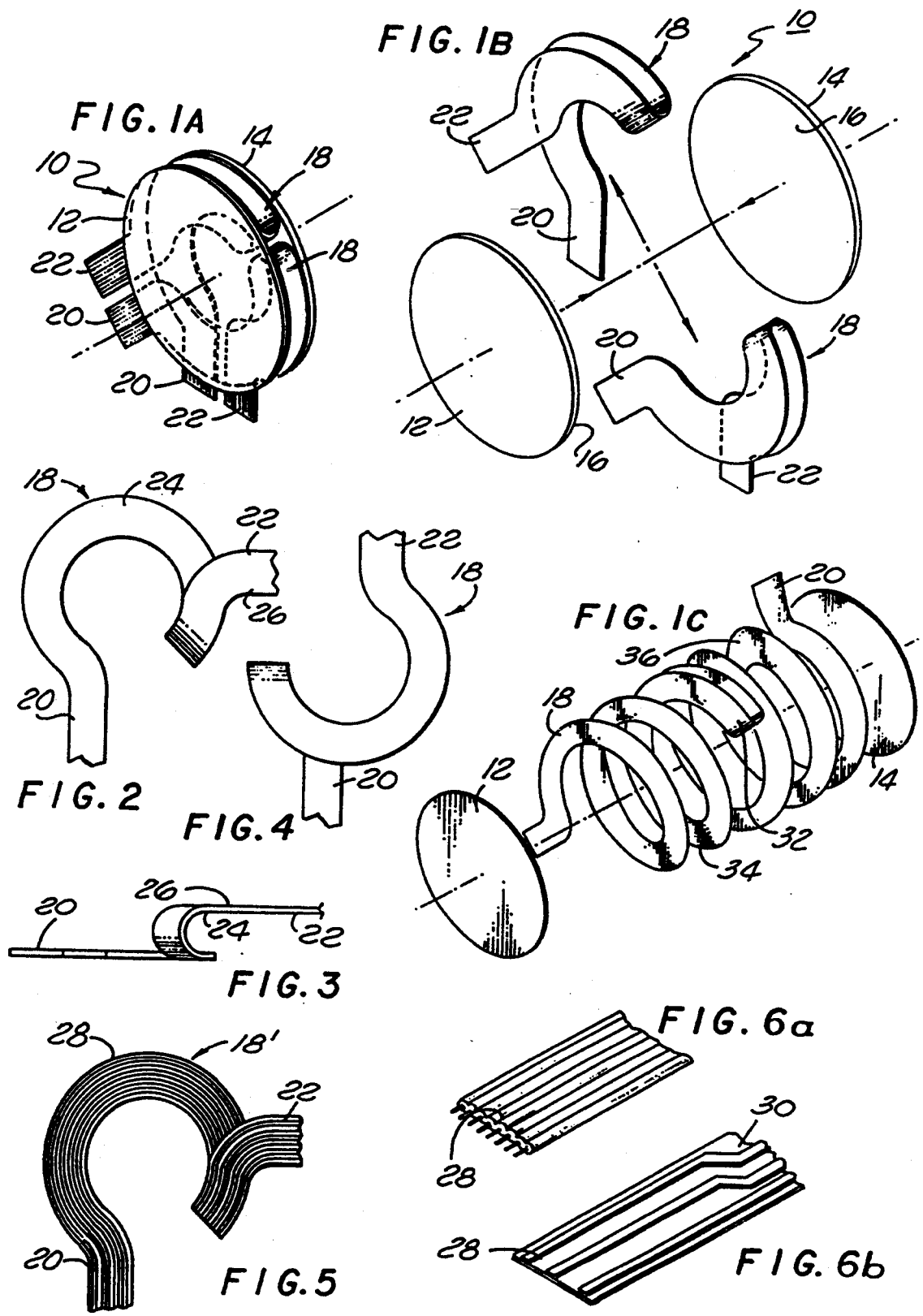

JOINT ASSEMBLY FOR POWER AND SIGNAL COUPLING BETWEEN RELATIVELY ROTATABLE STRUCTURES

This application is a continuation-in-part of application Ser. No. 07/737,784 filed on Jul. 30, 1991, now U.S. Pat. No. 5,210,378.

BACKGROUND OF THE INVENTION

1. Field of Invention

The present invention is a cable with a predetermined shape that allows two members to rotate relative to each other.

2. Description of Related Art

Robots typically have at least one degree of freedom that allows relative rotational movement between two rigid structures. The structure that is in motion may be a camera that is coupled to power, recording means, etc. by a plurality of wires. The wire is usually attached to the robot such that it must pass through a joint between the two structures. To allow the wire to move with the rotating structure, the wire is provided with additional length or slack, so that the wire can extend when the rotating structure is rotated into its maximum extension. The extra wire length dangles about and is susceptible to entanglement with the rotating structure. Because the wire typically extends through the joint, the wire can also become pinched and severed by the rotation of the structure. Rotating electrical couplings such as slip rings can be used, but these are subject to wear and contamination and can create an undesirable amount of electrical resistance in the line, particularly when power or signals must pass over multiple joints in series.

Therefore what is needed is a wire configuration that allows relative rotational movement between two structures without having to provide excess wire length that can become entangled, pinched, or produce an excessive amount of electrical resistance.

SUMMARY OF THE INVENTION

The present invention is a joint assembly for allowing relative rotational movement of a camera relative to a stationary base structure. The assembly has a first flexible member which allows the camera to pan the surrounding are and a second flexible member which allows the camera to tilt. Each flexible member has a first surface facing a first direction and second surface facing a second opposite direction. One end each flexible member is folded over onto itself so that a portion of the second surface faces the first direction. The flexible members are constructed in an essentially radial shape to define a radial path. When an end of a flexible member moves along the arcuate path the member rolls over itself. That is, the portion of the flexible member that is rolled over, has its second surface facing the first direction instead of the second direction. The flexible member is preferably constructed with a plurality of electrical lines or wires, wherein all the wires move in an orderly pattern without entanglement.

Therefore it is an object of this invention to provide an electrical cable connected to two structures, that allows the structures to rotate relative to each other without causing entanglement or pinching of the cable.

BRIEF DESCRIPTION OF THE DRAWINGS

The objects and advantages of the present invention will become more readily apparent to those skilled in the art after reviewing the following detailed description and accompanying drawings, wherein:

FIG. 1A is a perspective view of a joint assembly of the present invention, showing two flexible members between two structures that can rotate relative to each other;

FIG. 1B is an exploded perspective view of FIG. 1 showing the folded arrangement of the two flexible members;

FIG. 1C is a perspective view of an alternate embodiment showing a single folded flexible member;

FIG. 2 is a top view of one of the flexible members of FIG. 1;

FIG. 3 is a side view of FIG. 2, showing how the cable rolls over itself;

FIG. 4 is the joint cable of FIG. 3, wherein one structure has rotated approximately 450 degrees relative to the other structure;

FIG. 5 is a joint cable similar to FIG. 3, showing a pattern of electrical conductors that extend through the cable joint;

FIG. 6a shows a cable comprising a plurality of wires each encapsulated by a layer of insulative material in a cable ribbon;

FIG. 6b shows a cable constructed from two electrically insulative sheets encapsulating a plurality of printed electrical conductors;

DETAILED DESCRIPTION OF THE INVENTION

Figures 7, 8:
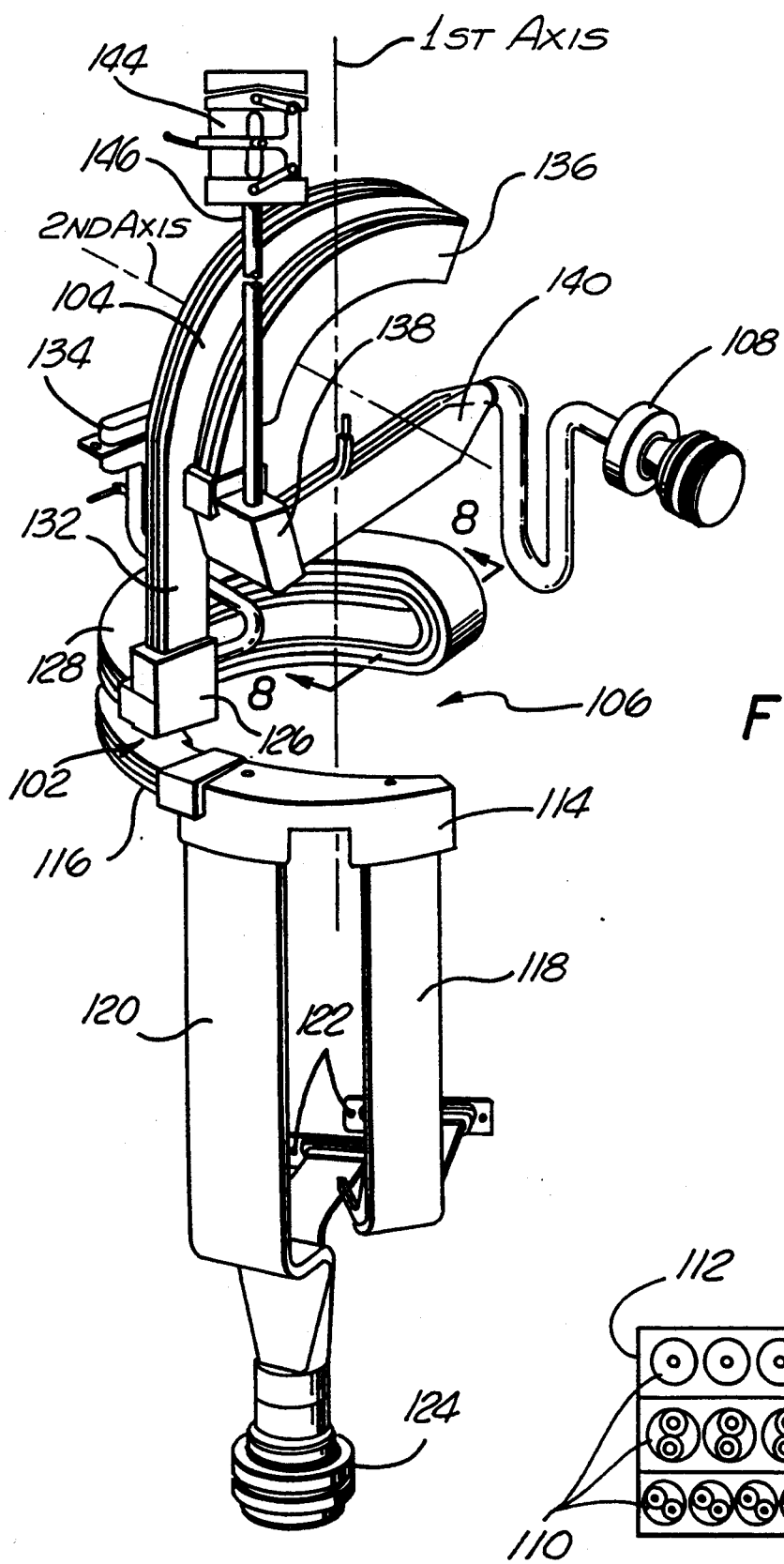
FIG. 7 is a perspective view of a pair of flexible members attacked to a robotic camera assembly.
FIG. 8 is a cross-sectional view of a flexible member of FIG. 7.

Referring to the drawings more particularly by reference numbers, FIGS. 1A and 1B show a preferred embodiment of the joint assembly 10 of the present invention. The assembly 10 has a first rigid structure 12 and a second rigid structure 14 each having a first surface 16 and adapted to rotate relative to each other as indicated by the arrows. The assembly 10 has two arcuate shaped flexible members 18 between the first 12 and second 14 structures. The flexible members 18 have ends 20 and 22, that are fixed relative to the structures. The members 18 are in a folded arrangement as shown in FIG. 1B.

The assembly 10 can be, by way of example, a robotic arm, wherein the first structure 12 is attached to a base and the second structure 14 is rotated about a rotary actuator relative to the first structure 12. The flexible member 18 is typically a wire cable to provide electrical signals and/or power to an electrical actuator located at the end of the second structure 14. Although two flexible members 18 are shown, it is to be understood that the joint assembly may have only one flexible member 18 connected to both structures. It is preferable to use two flexible members 18, to increase the wiring density of the cable. The flexible member 16 could also be a hose adapted to allow a fluid medium such as pressurized air or hydraulic fluid, to be supplied from a fluid source to an actuator located at the end of the second structure 14. It being understood that the flexible member of the disclosed configuration can be used for any conduit that extends between two structures that rotate relative to each other.

FIG. 2 shows a top view of one of the flexible members of the present invention. The first end 20 of the member 18 is attached to one structure and the second end 22 is attached to another structure 14. A first surface 24 of the flexible member 18 faces a first direction and a second opposite surface 26 of the member 18 faces a second opposite direction. The flexible member 18 is preferably constructed in a circular shape with a center preferably coinciding with the center of relative rotation between the two structures. Although a circular shape is shown, it is to be understood that any shape can be used including an arc portion of a circle. FIGS. 3 and 4 show the movement of the flexible member 16 as the second end 22 and attached structure is rotated in a counterclockwise direction relative to the first end 20. As the second end 22 is rotating, the flexible member 16 rolls onto itself such that the first surface 24 is facing the second direction. The portion of the flexible member 18 having the second surface 26 facing the first direction is approximately one-half the radial distance rotated by end 22, wherein the member 18 is being continuously folded in-half. The second end 22 and adjoining structure can therefore rotate greater than 360 degrees, because the actual displacement of the member 18 is one-half the radial movement of the second end 22. Theoretically a circular member having 360 degrees of displacement can allow 720 degrees of rotation. In practice the actual amount of rotation is limited by the width of the flexible member 16 and the space between the structures, and is typically in the range of 680 degrees. Referring again to FIG. 1A, it can be seen that two flexible members 18 can be attached as mirror images of each other. Such an arrangement allows both flexible members 18 to roll onto themselves without interfering with each other when the structures are rotated.

As shown in FIG. 1C, the joint assembly 10 may have a single flexible member 18 that has a folded portion 32. The member 18 has a number of first turns 34 between the folded portion 32 and the end 20 that spiral in a first direction, and a number of second turns 36 between the folded portion 32 and the end 22 that spiral in a second opposite direction. As the ends 20 and 22 are rotated relative to each, the member 18 rolls onto itself, wherein the folded portion 32 will move toward one of the structures 12 or 14. For example, if the end 22 is rotated in a counterclockwise direction, the member 18 will turn and the folded portion 32 will move toward structure 14. The end 22 can be rotated until the folded portion 32 reaches end 20. For every turn in the member 18, the ends and attached structures can rotate 720 degrees relative to each other. Thus for a member 18 with two first 34 and two second 36 turns, the structures can be rotated at least 1420 degrees in either direction.

The flexible member can be a flexible printed circuit 18' that has a plurality of electrical conductors 28 that extend through the member as shown in FIG. 5. The conductors 28 can provide electrical signals or power to an electrical device located on the second structure 14. The circuit can be a flexible printed board known in the art as a flex-circuit, which comprises two electrically insulative sheets 30 that encapsulate copper conductors 28 that are etched in a predetermined pattern, as shown in FIG. 6b. The conductors 28 are preferably quite thin, to reduce the amount of stress induced into the copper when the flex-circuit is bent as shown in FIG. 3. In the alternative, the flexible member can be a plurality of conductive wires each encapsulated by a layer of insulation and attached to each other as shown in FIG. 6a, or a bundle of optic fibers that transmit light. In addition, the flexible member could be a hollow hose or tube, that allows either pressurized air or hydraulic fluid to flow therethrough. In fact any flexible member that extends through two structures that rotate relative to each other can be used. The joint assembly of this invention provides excess wire length in a compact arrangement such that the length of the wire between the two ends 20 and 22 are always the same. With such a configuration there is no lagging portions of the wire that can become entangled or pinched by the structure.

FIG. 7 shows a first flexible member 102 and a second flexible member 104 used in a joint assembly 106 which allows a camera 108 to move relative to a base structure (not shown). The camera 108 is coupled to actuators (not shown) which rotate the camera 108 about a first axis and a second axis. The first and second axis correspond with the center line of the arcuate shaped flexible members 102 and 104.

As shown in FIG. 8, each flexible member preferably has a plurality of electrically conductive wires 110 that are embedded in a sheet of flexible dielectric material 112. The flexible dielectric material is typically a silicone rubber. In the preferred embodiment, the flexible members each have three sheets of silicone rubber which contain conductive wires 110.

The joint assembly 106 has a first electrical connector block 114 which couples a first end 116 of the first flexible member 102 to a pair of flexible cables 118 and 120. The flexible cables 118 and 120 are connected to electrical connectors 122 and 124. The flexible cables 118 and 120 may also be constructed to have a plurality of wires embedded in a sheet of silicone. The connectors 122 and 124 are mated to correspond connectors that provide an interface with external devices (not shown) that receive and transmit electrical signals through the joint assembly 106. The connector block 114 has a plurality of terminals (not shown) that receive the ends of the wires and provide a conductive path between the wires of the first flexible member 102 and the wires of the flexible cables 118 and 120.

The joint assembly 106 has a second connector block 126 which couples the second end 128 of the first flexible member 102 to the first end 130 of the second flexible member 104. The second block 126 electrically couples the wires of the first member 102 with the wires of the second member 104. Extending from the second connector block 126 is a flexible cable 132 that couples the flexible members 102 and 104 to connector 134. The connector 134 is typically coupled to the actuator which rotates the camera 108 about the second axis.

The second end 136 of the second flexible member 104 is connected to a third connector block 138 which electrically couples the member 104 to flexible cable 140. The flexible cable 138 is coupled to the camera 108 by a flexible harness 140. The third connector block 138 also couples the flexible members 102 and 104 to a camera light 144 through flexible cable 146.

In operation, an actuator may rotate the camera 108 about the first axis which causes the first flexible member 102 to roll relative to itself. If the camera 108 is rotated in a clockwise direction the first member 102 will unfold, if the camera 108 is rotated in a counterclockwise direction the first member 102 will continually fold over. Likewise, when the system actuator rotates the camera 108 in a clockwise direction about the second axis the second member 104 will unfold, wherein a counterclockwise rotation will continually fold the second member 104. What is thus provided is an assembly joint which provides two degrees of freedom and moves the wires of the system in an orderly fashion without entangling the same.

While certain exemplary embodiments have been described in detail and shown in the accompanying drawings, it is to be understood that such embodiments are merely illustrative of, and not restrictive on the broad invention, and that the invention is not to be limited to the specific constructions and arrangements shown and described, since various other modifications may occur to those skilled in the art.

What is claimed is:

1. A joint assembly, comprising:
   a first structure;
   a first flexible member having a plurality of transmitting elements that can carry signals, said first flexible member having a predefined shape defining a predefined path, a first surface facing a first direction and a second surface facing a second opposite direction, said first flexible member having a first end operatively connected to said first structure and a second end adapted to move about a first axis in approximately said predefined path such that said first surface of a portion of said first flexible member faces said second direction;
   a second flexible member having a plurality of transmitting elements that can carry said signals, said second flexible member having a predefined shape defining a predefined path, a first surface facing a third direction and a second surface facing a fourth opposite direction, said second flexible member having a first end operatively connected to said second end of said first flexible member and a second end adapted to move about a second axis in approximately said predefined path such that said first surface of a portion of said second flexible member faces said fourth opposite direction; and,
   a second structure operatively connected to said second end of said second flexible member and adapted to rotate about the first axis of said first flexible member and the second axis of said second flexible member.

2. The assembly as recited in claim 1, wherein the first axis is essentially perpendicular to the second axis.

3. The assembly as recited in claim 1, wherein said predefined shapes of said first and second flexible members is a circle defining a circular path.

4. The assembly as recited in claim 1, wherein said first and second flexible members include a plurality of conductive wires embedded in a sheet of flexible dielectric material.

5. The assembly as recited in claim 4, wherein said flexible members each have three sheets of flexible dielectric material which have conductive wires embedded therein.

6. The assembly as recited in claim 4, further comprising an electrical connector block which is attached to said second end of said first flexible member and said first end of said second flexible member, and electrically couples said wires of said flexible members.

7. A joint assembly, comprising:
   a first structure;
   a first flexible member having a plurality of wires embedded into a sheet of flexible dielectric material, said first flexible member having a circular shape defining a circular path, a first surface facing a first direction and a second surface facing a second opposite direction, said first flexible member having a first end operatively connected to said first structure and a second end adapted to move about a first axis in approximately said circular path such that said first surface of a portion of said first flexible member faces said second opposite direction;
   a second flexible member having a plurality of wires embedded into a sheet of flexible dielectric material, said second flexible member having a circular shape defining a circular path, a third surface facing a first direction and a fourth surface facing a second opposite direction, said second flexible member having a first end operatively connected to said second end of said first flexible member and a second end adapted to move about a second axis in approximately said circular path such that said first surface of a portion of said second flexible member faces said fourth opposite direction, the second axis being essentially perpendicular to the first axis; and,
   a second structure operatively connected to said second end of said second flexible member and adapted to rotate about the first axis of said first flexible member and the second axis of said second flexible member.

8. The assembly as recited in claim 7, wherein said flexible members each have three sheets of flexible dielectric material which have conductive wires embedded therein.

9. The assembly as recited in claim 8, further comprising an electrical connector block which is attached to said second end of said first flexible member and said first end of said second flexible member, and electrically couples said wires of said flexible members.

* * * * *